(12) United States Patent
Liu et al.

(10) Patent No.: US 9,425,155 B2
(45) Date of Patent: Aug. 23, 2016

(54) WAFER BONDING PROCESS AND STRUCTURE

(71) Applicant: Taiwan Semiconductor Manufacturing Company, Ltd., Hsin-Chu (TW)

(72) Inventors: Ping-Yin Liu, Yonghe (TW); Hsun-Chung Kuang, Hsin-Chu (TW); Cheng-Tai Hsiao, Tainan (TW); Xin-Hua Huang, Xihu Township (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/189,917

(22) Filed: Feb. 25, 2014

(65) Prior Publication Data
US 2015/0243611 A1 Aug. 27, 2015

(51) Int. Cl.
*H01L 23/48* (2006.01)
*H01L 23/00* (2006.01)

(52) U.S. Cl.
CPC .............. *H01L 24/06* (2013.01); *H01L 24/03* (2013.01); *H01L 24/89* (2013.01); *H01L 2224/05083* (2013.01); *H01L 2224/8084* (2013.01); *H01L 2924/12042* (2013.01)

(58) Field of Classification Search
CPC ....... H01L 24/17; H01L 24/03; H01L 24/09; H01L 24/11
USPC ....... 438/637, 639, 640, 667, 668, 672, 675, 438/700, 701, 713; 257/773–774
See application file for complete search history.

(56) References Cited

U.S. PATENT DOCUMENTS

| | | |
|---|---|---|
| 6,350,685 B1 | 2/2002 | Asahina et al. |
| 2008/0268614 A1 | 10/2008 | Yang et al. |
| 2009/0053426 A1 | 2/2009 | Lu et al. |
| 2014/0203445 A1* | 7/2014 | Ting .................... H01L 23/5226 257/774 |

FOREIGN PATENT DOCUMENTS

| | | |
|---|---|---|
| JP | 2000182993 A | 6/2000 |
| JP | 5023413 B2 | 9/2012 |
| KR | 20030002529 A | 1/2003 |
| KR | 20100078344 A | 7/2010 |
| TW | 200616086 A | 5/2006 |
| TW | 200842933 A | 11/2008 |
| TW | 201312656 A | 3/2013 |

* cited by examiner

*Primary Examiner* — Hoa B Trinh
(74) *Attorney, Agent, or Firm* — Slater Matsil, LLP (57) ABSTRACT

A semiconductor device and a method of fabricating the same are introduced. In an embodiment, one or more passivation layers are formed over a first substrate. Recesses are formed in the passivation layers and one or more conductive pads are formed in the recesses. One or more barrier layers are formed between the passivation layers and the conductive pads. The conductive pads of the first substrate are aligned to the conductive pads of a second substrate and are bonded using a direct bonding method.

20 Claims, 6 Drawing Sheets

WAFER BONDING PROCESS AND STRUCTURE

BACKGROUND

Semiconductor manufacturers face a constant challenge to comply with Moore's Law. They constantly strive to continually decrease feature sizes, such as sizes of active and passive devices, interconnecting wire widths and thicknesses, and power consumption as well as increase device density, wire density and operating frequencies. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some methods of forming 3DICs involve bonding together two or more semiconductor wafers, and active circuits such as logic, memory, processor circuits and the like located on different semiconductor wafers. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is that much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, a method for wafer bonding. Hereinafter, various embodiments will be explained in detail with reference to the accompanying drawings.

Figure 1:
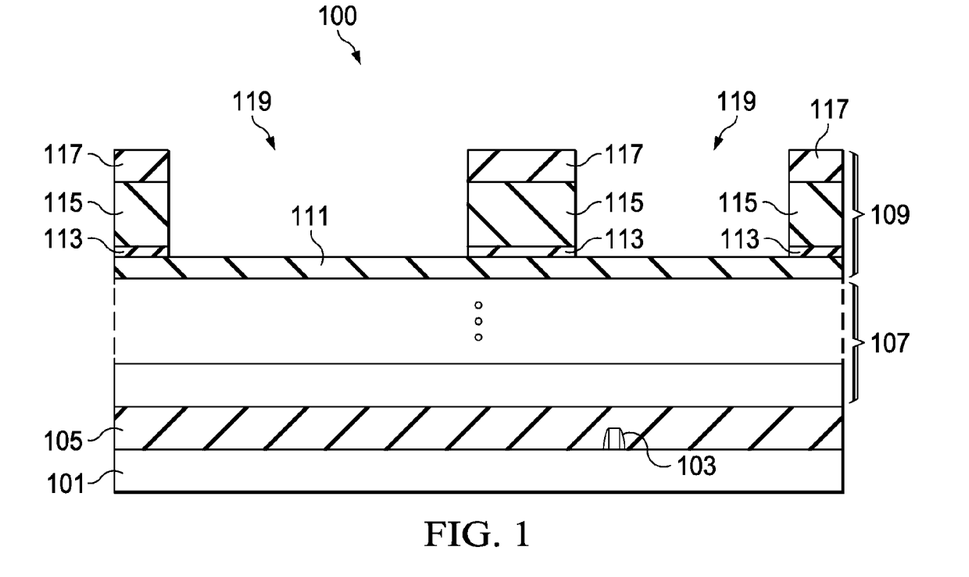
FIGS. 1-5 are cross-sectional views illustrating a wafer bonding process in accordance with some embodiments.

With reference to FIG. 1, there is shown a partial cross-sectional view of a first wafer 100. The first wafer 100 may include a substrate 101, devices 103 on the substrate 101, an interlayer dielectric (ILD) layer 105 over the devices 103, one or more metallization layers 107 over the ILD layer 105 and a passivation layer 109 over the metallization layers 107. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The devices 103 are represented in FIG. 1 as a single transistor. However, the devices 103 may comprise a wide variety of active and passive devices such as transistors, diodes, capacitors, resistors, inductors and the like, which may be used to generate the desired structural and functional requirements of the design for the first wafer 100. The devices 103 may be formed using any suitable methods either within or on the surface of the substrate 101, or in an overlying dielectric layer. One of ordinary skill in the art will appreciate that the above examples are provided for illustrative purposes only to further explain applications of some illustrative embodiments and are not meant to limit the disclosure in any manner.

The ILD layer 105 is formed over the substrate 101 and the devices 103 and is designed to isolate the devices 103 from the metallization layers 107. The ILD layer 105 may comprise silicon dioxide, low-K dielectric materials (materials having a dielectric constant lower than silicon dioxide), such as silicon oxynitride, phosphosilicate glass (PSG), borophosphosilicate glass (BPSG), fluorinated silicate glass (FSG), organosilicate glasses (OSG), $SiO_xC_y$, Spin-On-Glass, Spin-On-Polymers, silicon carbon material, compounds thereof, composites thereof, combinations thereof, or the like, deposited by any suitable method, such as spin-on, chemical vapor deposition (CVD), and plasma-enhanced CVD (PECVD), or the like. Porous versions of the above materials may also be used. These materials and processes are provided as examples and other materials and processes may be used.

The metallization layers 107 are formed over the ILD layer 105 and are designed to connect the devices 103 to form functional circuitry. While illustrated in FIG. 1 as a single layer, the metallization layers 107 are formed of alternating layers of dielectric and conductive material and may be formed through any suitable process (such as deposition, damascene, dual damascene, etc.). The precise number of metallization layers 107 is dependent upon the design of the first wafer 100.

It should also be noted that one or more etch stop layers (not shown) may be positioned between adjacent layers, e.g., the ILD layer 105 and the substrate 101. Generally, the etch stop layers provide a mechanism to stop an etching process when forming vias and/or contacts. The etch stop layers are formed of a dielectric material having a different etch selectivity from adjacent layers, e.g., the underlying substrate 101 and the overlying ILD layer 105. In an embodiment, etch stop layers may be formed of SiN, SiCN, SiCO, CN, combinations thereof, or the like, deposited by CVD or PECVD techniques.

The passivation layer 109 is formed over the first wafer 100. The passivation layer 109 may be formed of one or multiple layers comprising silicon dioxide, undoped silicon glass (USG), silicon oxynitride (SiON), phosphosilicate glass (PSG), SiN, compounds thereof, composites thereof, combinations thereof, or the like, deposited by any suitable method, such as spin-on, chemical vapor deposition (CVD), and plasma-enhanced CVD (PECVD), or the like. These materials and processes are provided as examples and other materials and processes may be used.

In some embodiments, the passivation layer 109 may be a composite structure comprising a first passivation layer 111 comprising USG, a second passivation layer 113 comprising SiN, a third passivation layer 115 comprising USG, and a fourth passivation layer 117 comprising SiON. Any of the above layers may also be used as an etch stop layer. One of ordinary skill in the art will appreciate that the above examples are provided for illustrative purposes only and the number of passivation layers and materials used may vary according to the specification of the first wafer 100.

Photolithography techniques may be used to pattern the passivation layer 109. Generally, a photoresist layer (not shown) is formed over the passivation layer 109 and then exposed to radiation such as ultraviolet light or an excimer laser through a reticle (not shown), in accordance with a desired pattern. A bake or cure operation may be performed, and a developer may be used to remove either the exposed or unexposed portions of the photoresist layer, depending on whether a positive or negative resist is utilized. Thus, a pattern that is used to form a first plurality of openings 119 in the passivation layer 109 is formed in the photoresist layer. The specific pattern of the first plurality of openings 119, as described herein, is for illustrative purposes only, and other patterns may be formed depending on the design of the first wafer 100.

With reference to FIG. 1, the passivation layer 109 is etched, for example, by an anisotropic dry etch process to remove exposed portions of the passivation layer 109. Such etching further forms the first plurality of openings 119 in the passivation layer 109. Multiple etch processes may be utilized to etch through the various layers of the passivation layer 109. Subsequently, the photoresist layer is removed using, for example, an ashing process in combination with a wet clean process. For example, in the embodiment described above in which the first passivation layer 111 comprises USG, the second passivation layer 113 comprises SiN, the third passivation layer 115 comprises USG, and the fourth passivation layer 117 comprises SiON, the etch process may comprise a reactive ion etching (RIE) process with sulfur hexafluoride ($SF_6$) plasma.

As will be described in greater detail below, the first plurality of openings 119 correspond to bonding pads, which may comprise a suitable metallic material. The bonding pads may be formed by suitable deposition for seed layer and barrier or plating processes for bulk metal. The bonding pads are subsequently used to bond different wafers as well as act as metallic contacts between devices on the bonded wafers.

Figure 2:
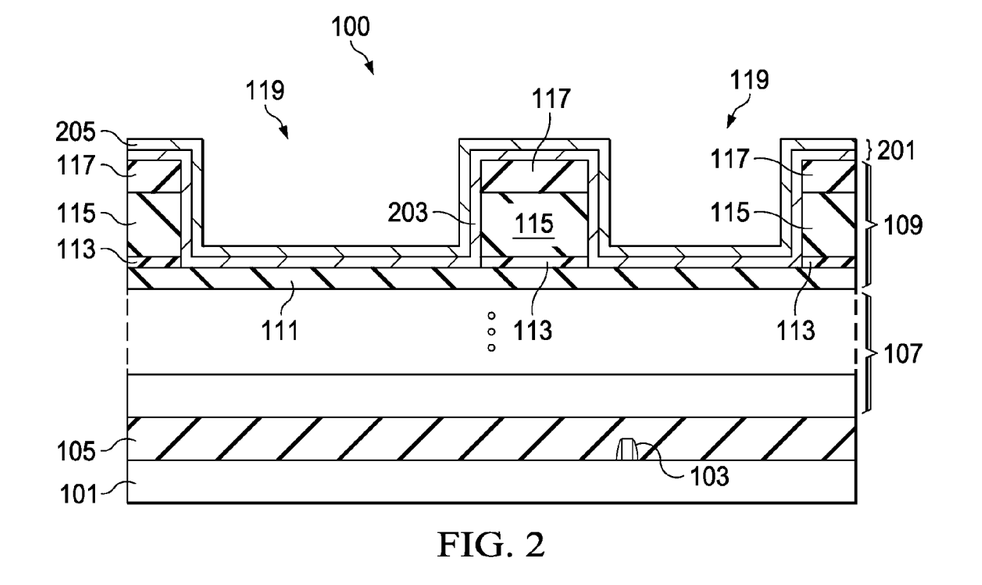

FIG. 2 illustrates a first barrier layer 201 formed in the first plurality of openings 119 of the passivation layer 109 to protect the passivation layer 109 from diffusion and metallic poisoning from a subsequently formed conductive material in the first plurality of openings 119. The first barrier layer 201 may be formed having a single layer or multiple layers and may comprise titanium, titanium nitride, tantalum, tantalum nitride, cobalt or other alternatives. The barrier layer may be formed using PVD, CVD, or the like.

In some embodiments, the first barrier layer 201 may comprise a first barrier sublayer 203 and a second barrier sublayer 205. In an embodiment, the first barrier sublayer 203 is formed of tantalum nitride (TaN) and has a first thickness less than about 500 Å, such as 250 Å, and the second barrier sublayer 205 is formed of cobalt (Co) and has a second thickness less than about 100 Å. One skilled in the art will realize, however, that the dimensions recited throughout the description are related to the technology node and may be reduced with the scaling of the technology node. In another embodiment, the first barrier sublayer 203 and the second barrier sublayer 205 may comprise, for example, TaN and nickel (Ni), respectively. In yet another embodiment, the first barrier sublayer 203 and the second barrier sublayer 205 may comprise, for example, TaN and iron (Fe), respectively.

Figure 3:
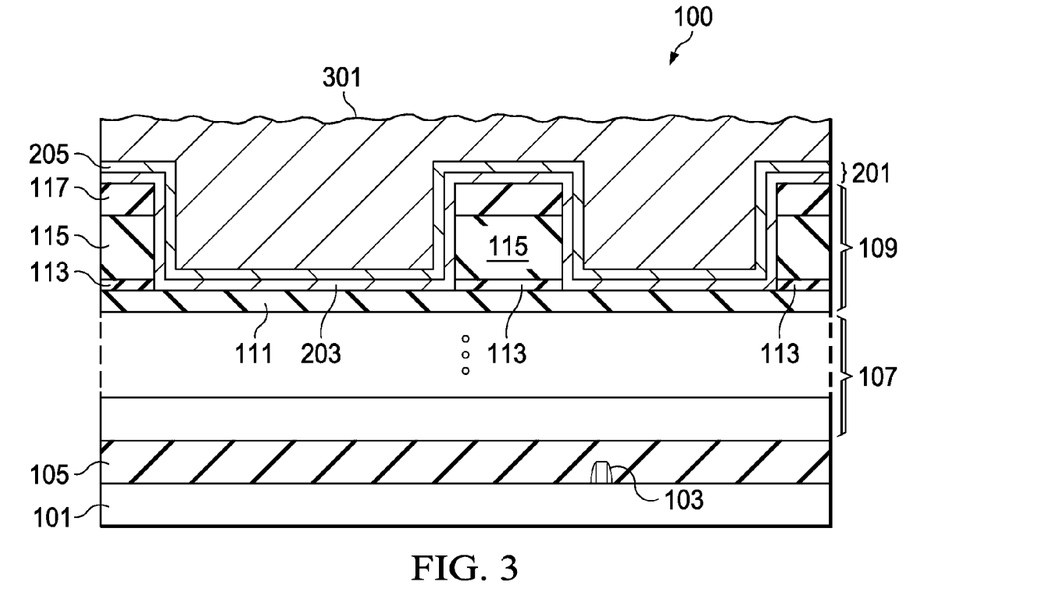

In reference to FIG. 3, a metallic layer 301 is deposited to fill the first plurality of openings 119 in the passivation layer 109 and form the bonding pads. The metallic layer 301 may comprise copper, silver, gold, tungsten, aluminum, and the like, and may be deposited using PVD, CVD, PECVD, plating, or similar.

Figure 4:
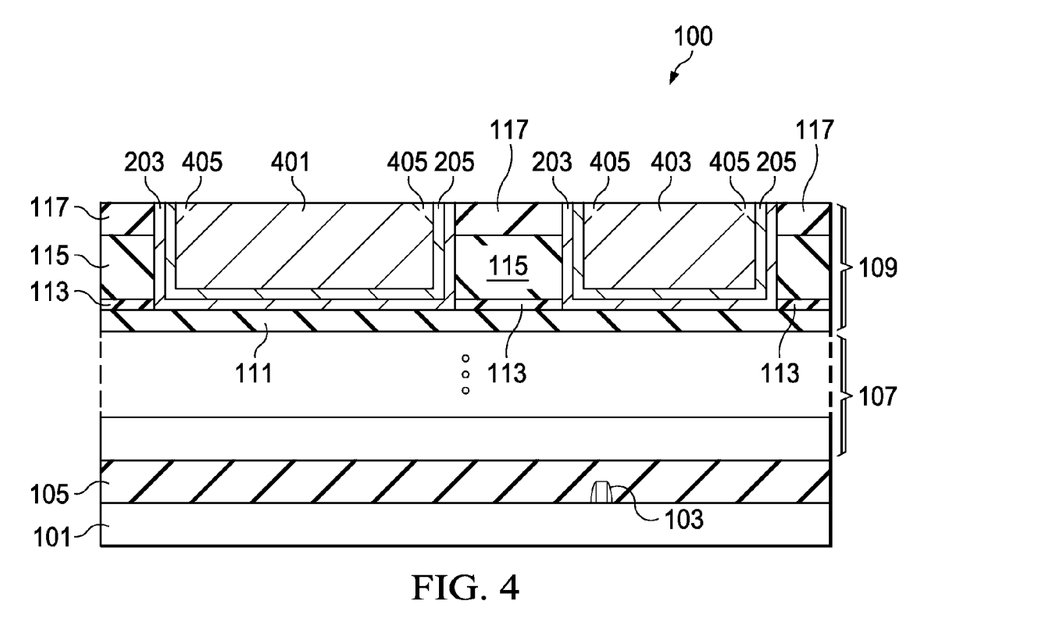

In reference to FIG. 4, a chemical mechanical polishing (CMP) is performed to remove excess material of the first barrier layer 201 and the metallic layer 301 from an upper surface of the passivation layer 109. During the CMP process highly corrosive chemicals, such as acids and bases, are used in conjunction with small abrasive particles, which perform chemical and mechanical removal of excess material, respectively. The remaining metallic material in the first plurality of openings 119 forms a first bonding pad 401 and a second bonding pad 403.

Subsequently, surface cleaning and surface activation of the first wafer 100 are performed to prepare the first wafer 100 for bonding. The surface cleaning is performed to remove CMP slurry and native oxide layers from the surface of the first wafer 100. The surface cleaning process may include methods with direct and non-direct contact with the surface of the first wafer 100, such as cryogenic cleaning, mechanical wiping and scrubbing, etching in a gas, plasma or liquid, ultrasonic and megasonic cleaning, laser cleaning, and the like. Subsequently, the first wafer 100 may be rinsed in de-ionized (DI) water and dried using a spin dryer or an isopropyl alcohol (IPA) dryer. In other embodiments, the first wafer 100 may be cleaned using RCA clean, or the like.

The surface activation may be performed to prepare the first wafer 100 for bonding. The surface activation process may include suitable processes, such as plasma etch or wet etch processes to remove native oxides, which may be formed after the wafer cleaning process, from the surface of the first wafer 100. In some embodiments, the bonding pads may comprise copper, and citric acid may be used to remove copper oxide from the surface of the pads. Subsequently, the first wafer may be rinsed in de-ionized (DI) water and dried using a spin dryer or an isopropyl alcohol (IPA) dryer.

FIG. 4 further illustrates formation of a first plurality of voids 405 in the first bonding pad 401 and in the second bonding pad 403 at interfaces of the bonding pads and the first barrier layer 201. The first plurality of voids 405 may be formed during CMP, wafer cleaning, and wafer activation processes, and are caused by galvanic corrosion of the bonding pads. To reduce the size of the first plurality of voids 405, materials for the first barrier sublayer 203, the second barrier sublayer 205 and the bonding pads are chosen such that a reduction potential difference between the first barrier layer 201 and the bonding pads is between about −1V and about +1V. In an embodiment, the first plurality of voids 405 are formed of size less than about 500 Å.

Figure 5:
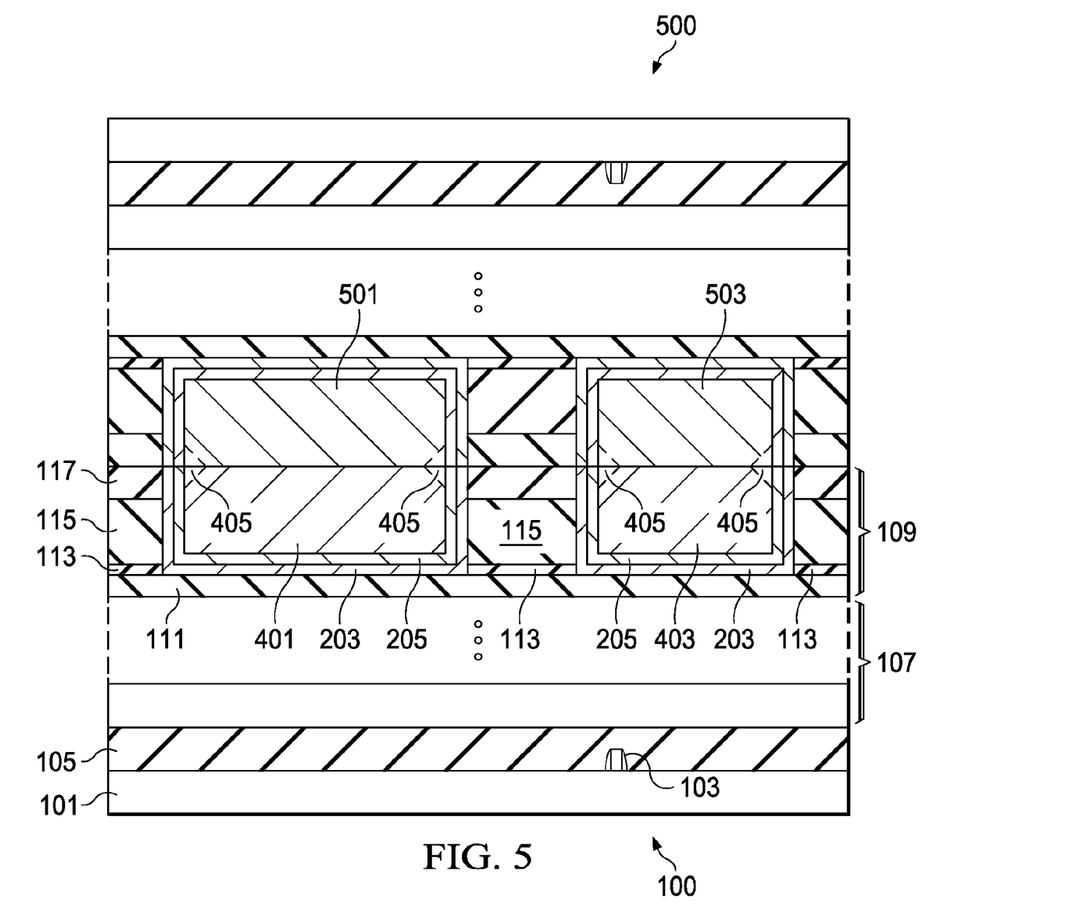

In reference to FIG. 5, the first wafer 100 is bonded to a second wafer 500. In an embodiment, the second wafer 500 is represented as being similar to the first wafer 100. However, one of ordinary skill in the art will appreciate that the above example is provided for illustrative purposes only to further explain applications of some illustrative embodiments and are not meant to limit the disclosure in any manner. In some embodiments, the second wafer 500 may comprise devices and circuitry that is different from the first wafer 100. In other embodiments the first wafer 100 may be fabricated using CMOS process while the second wafer 500 may be manufactured using MEMS process.

In an embodiment, the first wafer 100 and the second wafer 500 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding (e.g., simultaneous metal-to-metal and dielectric-to-dielectric bonding), any combinations thereof and/or the like. For example, the first wafer 100 and the second wafer 500 may be bonded using hybrid bonding. The first bonding pad 401 and the second bonding pad 403 of the first wafer 100 are aligned to a third bonding pad 501 and a fourth bonding pad 503 of the second wafer 500, respectively. Subsequently, the surfaces of the first wafer 100 and the second wafer 500 are put into physical contact at room temperature, atmospheric pressure, and ambient air. The first bonding pad 401 and the third bonding pad 501 as well as the second bonding pad 403 and the fourth bonding pad 503 are bonded using direct metal-to-metal bonding. At the same time, passivation layers of the first wafer 100 and the second wafer 500 are bonded using direct dielectric-to-dielectric bonding. Subsequently, optional annealing may be performed to enhance the bonding strength between the first wafer 100 and the second wafer 500. In some embodiments, annealing may be performed at a temperature between about 250 C and about 400 C for a time interval between about 0.5 hr and about 4 hrs.

It should be noted that the bonding may be at wafer level, wherein the first wafer 100 and the second wafer 500 are bonded together, and are then diced into separated dies. Alternatively, the bonding may be performed at the die-to-die level, or the die-to-wafer level.

In further reference to FIG. 5, in some embodiments, the first bonding pad 401, the second bonding pad 403, the third bonding pad 501, and the fourth bonding pad 503 may serve dual functionality. For example, the first bonding pad 401 and the third bonding pad 501 may provide mechanical bonding as well as electrical connection between the first wafer 100 and the second wafer 500. The first bonding pad 401 may be formed to have electrical contact with the metallization layers 107 of the first wafer 100, and the third bonding pad 501 may be formed to have electrical contact with respective metallization layers of the second wafer 500. A bond between the first bonding pad 401 and the third bonding pad 501 may provide electrical pathway between the devices 103 of the first wafer 100 and respective devices of the second wafer. In some embodiments, size reduction of the first plurality of voids 405, which was discussed in detail above, may improve quality of electrical connection between the first bonding pad 401 and the third bonding pad 501 and, thus, between the first wafer 100 and the second wafer 500.

In some embodiments, the second bonding pad 403, which may act as a dummy bonding pad, may not provide electrical connection between the first wafer 100 and the second wafer 500 and may serve to mechanically bond the first wafer 100 and the second wafer 500. For example, the second bonding pad 403 may be formed to have one or more dielectric layers interposed between the second bonding pad 403 and the metallization layers 107, and may be electrically isolated from the devices 103 of the first wafer 100. Regardless whether there is an electrical path between the fourth bonding pad 503 and the respective metallization layers of the second wafer 500, a bond between the second bonding pad 403 and the fourth bonding pad 503 may be electrically inert and may provide a mechanical bond between the first wafer 100 and the second wafer 500. In some embodiments, the dummy bonding pads may be used to mitigate adverse effects from manufacturing processes. For example, the dummy bonding pads may improve CMP performance and reduce effects from metal dishing and dielectric delamination.

One of ordinary skill in the art will appreciate that the above method for forming bonding pads may be also used to form, for example, metallic lines and vias in metallization layers as well as metallic lines and vias in redistribution layers.

FIGS. 6-9 are various cross-sectional views of the first wafer 100 illustrating a method for forming the metallization layers 107 in accordance with some embodiments. The various reference numerals of FIGS. 6-9 having like reference numerals of FIGS. 1-5 refer to like elements. Accordingly, FIGS. 6-9 illustrate an embodiment in which features of the present disclosure are utilized to form an interconnect structure in one of the metallization layers 107 illustrated in FIG. 1. For purposes of illustration, FIGS. 6-9 illustrate forming an interconnect structure in a first metallization layer $107_1$. Other embodiments may utilize features of the present disclosure in other metallization layers. In some embodiments, as described in greater detail below, an interconnect structure may be formed using, for example, a damascene method, a dual damascene method, or the like.

Figure 6:
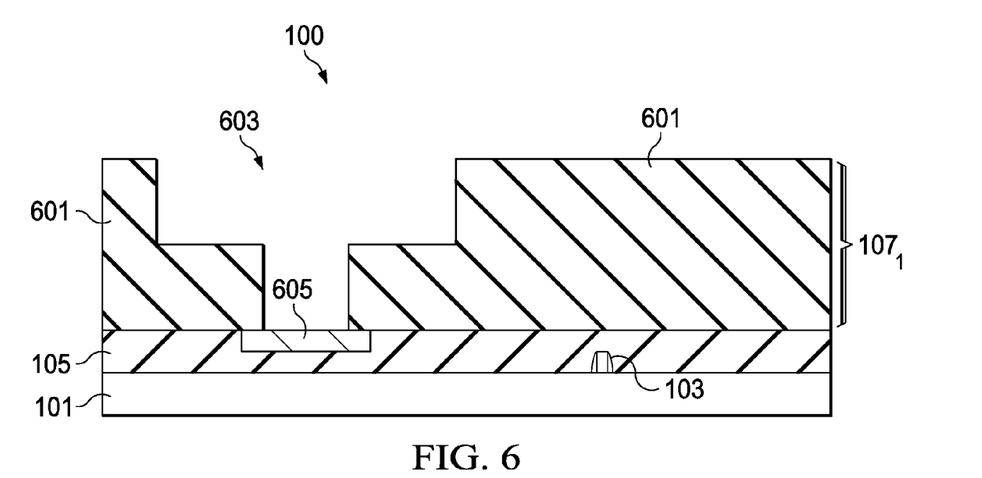
FIGS. 6-9 are cross-sectional views illustrating a method for forming metallization layers in accordance with some embodiments.

Referring now to FIG. 6, in some embodiments, an inter-metal dielectric (IMD) layer 601 of the first metallization layer $107_1$ may comprise of materials similar to the ILD layer 105 and may be formed using similar methods as the ILD layer 105. Photolithography techniques may be used to pattern the IMD layer 601 of the first metallization layer $107_1$. Generally, a photoresist layer (not shown) is formed over the IMD layer 601 and then exposed to radiation such as ultraviolet light or an excimer laser through a reticle (not shown), in accordance with a desired pattern. A bake or cure operation may be performed, and a developer may be used to remove either the exposed or unexposed portions of the photoresist layer, depending on whether a positive or negative resist is utilized. Thus, a pattern that is used to form a second opening 603 in the IMD layer 601 is formed in the photoresist layer. The specific pattern of the second opening 603, as described herein, is for illustrative purposes only, and other patterns may be formed depending on the design of the first wafer 100.

The IMD layer 601 is etched, for example, by an anisotropic dry etch process to remove exposed portions of the IMD layer 601, thereby exposing at least a portion of a conductive element 605 in the ILD layer 105. Such etching further forms the second opening 603 in the IMD layer 601. In some embodiments, one or more etch processes may be used to pattern the IMD layer 601, and one or more etch stop layers (not shown) may be formed in the IMD layer 601 to aid the patterning processes. Subsequently, the photoresist layer is removed using, for example, an ashing process in combination with a wet clean process.

Figure 7:
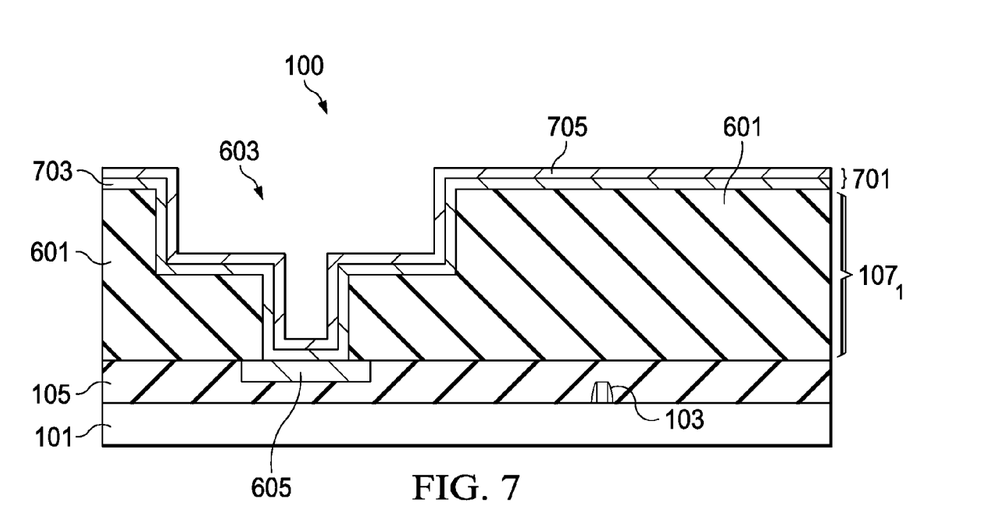

FIG. 7 illustrates a second barrier layer 701 formed in the second opening 603 of the IMD layer 601 to protect the IMD layer 601 from diffusion and metallic poisoning from a subsequently formed conductive material in the second opening 603. The second barrier layer 701 may be formed having a single layer or multiple layers and may comprise, for example, titanium, titanium nitride, tantalum, tantalum nitride, cobalt or other alternatives. The barrier layer may be formed using PVD, CVD, or the like.

For example, the second barrier layer 701 may be a composite structure comprising a third barrier sublayer 703 and a fourth barrier sublayer 705 as illustrated in FIG. 7. In an embodiment, the third barrier sublayer 703 is formed of tantalum nitride (TaN) and has a first thickness less than about 500 Å, such as 250 Å, and the fourth barrier sublayer 705 is formed of cobalt (Co) and has a second thickness less than about 100 Å. One skilled in the art will realize, however, that the dimensions recited throughout the description are related to the technology node and may be reduced with the scaling of the technology node.

Figure 8:
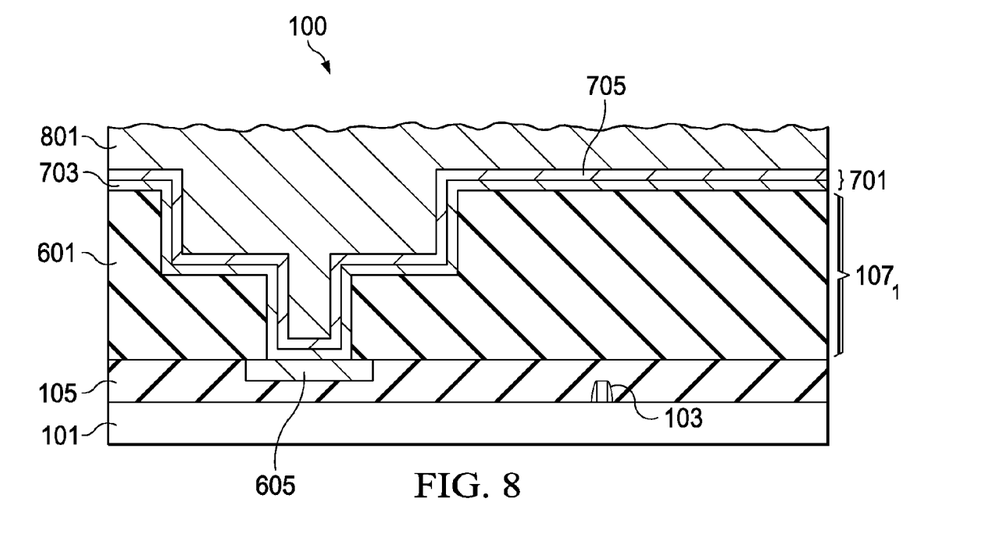

In reference to FIG. 8, a metallic material 801 is deposited to fill the second opening 603 in the IMD layer 601 and form an interconnect structure. The metallic material 801 may comprise copper, silver, gold, tungsten, aluminum, and the like, and may be deposited using PVD, CVD, PECVD, plating, or similar.

Figure 9:
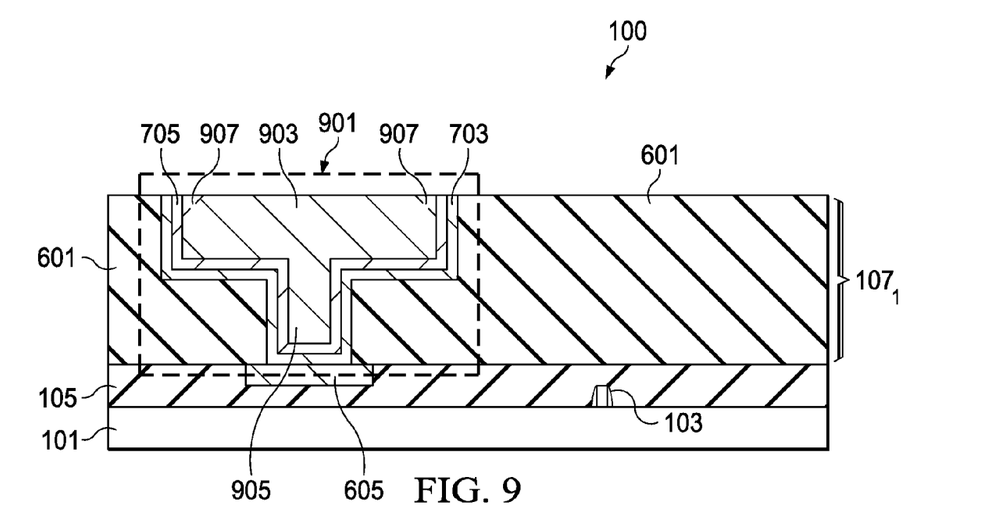

In reference to FIG. 9, a chemical mechanical polishing (CMP) is performed to remove excess material of the second barrier layer 701 and the metallic material 801 from an upper surface of the IMD layer 601. During the CMP process highly corrosive chemicals, such as acids and bases, are used in conjunction with small abrasive particles, which perform chemical and mechanical removal of excess material, respectively. The remaining metallic material 801 in the second opening 603 forms an interconnect structure 901. In an embodiment, the interconnect structure 901 may comprise a metal line 903 and a via 905. The interconnect structure 901, as described herein, is for illustrative purposes only, and one or more interconnect structures having different designs may be formed in the IMD layer 601 depending on the specification of the first metallization layer $107_1$. For example, in some embodiments, the interconnect structure 901 may comprise a via. In other embodiments, the interconnect structure 901 may comprise a metal line.

FIG. 9 further illustrates formation of a second plurality of voids 907 in the metal line 903 at interfaces between the metal line 903 and the second barrier layer 701. The second plurality of voids 907 may be formed during CMP and are caused by galvanic corrosion of the bonding pads. To reduce the size of the second plurality of voids 907, materials for the third barrier sublayer 703, the fourth barrier sublayer 705, and the interconnect structure 901 are chosen such that a reduction potential difference between the second barrier layer 701 and the interconnect structure 901 is between about −1V and about +1V. In an embodiment, the second plurality of voids 907 is formed of size less than about 500 Å.

Figure 10:
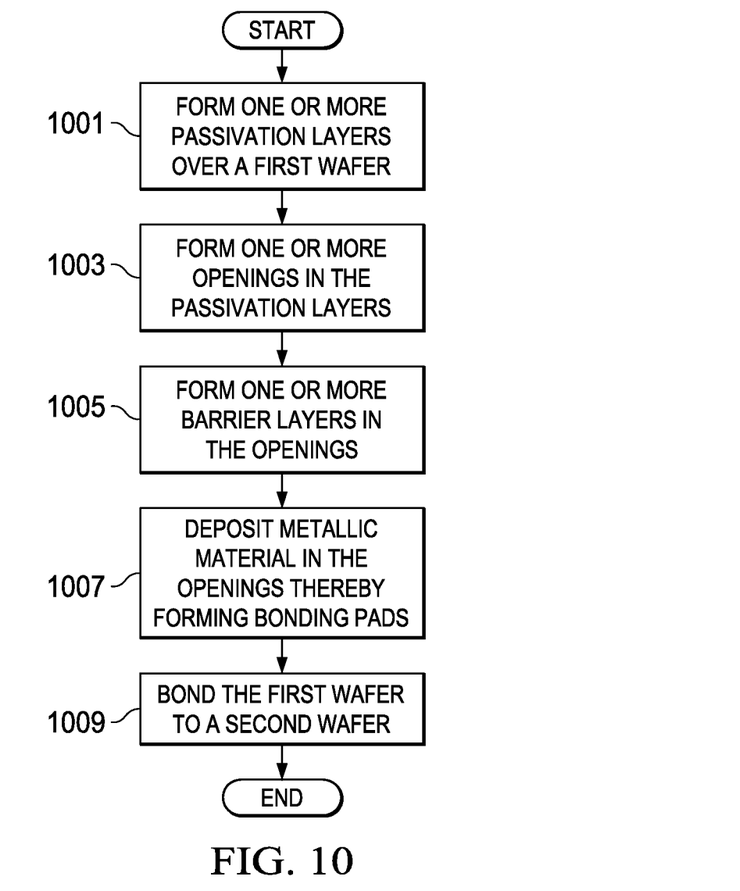
FIG. 10 is a flowchart illustrating a wafer bonding method in accordance with some embodiments.

FIG. 10 is a flowchart illustrating a wafer bonding method in accordance with an embodiment. The method begins at step 1001, wherein one or more passivation layers are formed over a first wafer as illustrated in FIG. 1. In step 1003, one or more openings are formed in the passivation layers as illustrated in FIG. 1. In reference to FIG. 2, in step 1005, one or more barrier layers are formed in the openings. In step 1007, a metallic material is deposited in the openings and bonding pads are formed as illustrated in FIGS. 3 and 4. Finally, in step 1009, the first wafer is bonded to a second wafer as illustrated in FIG. 5.

In an embodiment, a semiconductor device comprises a first substrate having a first dielectric layer thereon, a first passivation layer overlying the first dielectric layers, the first passivation layer having a first recess. The semiconductor device further comprises a first barrier layer along sidewalls of the first recess, and a first external contact pad in the first recess, the first barrier layer being interposed between the first external contact pad and the first passivation layer.

In another embodiment, a semiconductor device comprises a first structure, which further comprises a first substrate, a first passivation layer over the first substrate, a first plurality of conductive pads in the first passivation layer, and a first barrier layer interposed between individual ones of the first plurality of conductive pads and the first passivation layer, the first barrier layer comprising a first barrier sublayer and a second barrier sublayer. The semiconductor device further comprises a second structure directly bonded to the first structure. The second structure comprises a second substrate, a second passivation layer over the second substrate, a second plurality of conductive pads in the second passivation layer, and a second barrier layer interposed between individual ones of the second plurality of the conductive pads and the second passivation layer, the second barrier layer comprising a third barrier sublayer and a fourth barrier sublayer. The second structure is bonded to the first structure such that the first plurality of conductive pads are aligned with respective ones of the second plurality of conductive pads.

In yet another embodiment, a method for bonding semiconductor structures, the method comprises providing a first substrate, forming a first passivation layer over the first substrate, forming a first recess in the first passivation layer, forming a first barrier layer in the first recess, and forming a first conductive pad in the first recess of the first passivation layer such that the first barrier layer is interposed between the first conductive pad and the first passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first passivation layer over a first substrate;
forming a first recess in the first passivation layer;
forming a first barrier layer in the first recess;
forming a first conductive pad in the first recess of the first passivation layer such that the first barrier layer is interposed between the first conductive pad and the first passivation layer; and
bonding a second conductive pad on a second substrate directly to the first conductive pad.

2. The method of claim 1, wherein forming the first barrier layer further comprises forming a first barrier sublayer and a second barrier sublayer in the first recess of the first passivation layer, wherein a reduction potential difference between the first barrier layer and the first conductive pad is between about −1V and about +1V.

3. The method of claim 1, further comprising:
forming a second passivation layer over the second substrate;
forming a second recess in the second passivation layer;
forming a second barrier layer in the second recess; and
forming the second conductive pad in the second recess of the second passivation layer such that the second barrier layer is interposed between the second conductive pad and the second passivation layer.

4. The method of claim 3, further comprising bonding the first passivation layer to the second passivation layer using a direct dielectric-to-dielectric bonding method.

5. The method of claim 4, further comprising bonding the first conductive pad to the second conductive pad using a direct metal-to-metal bonding method.

6. The method of claim 5, further comprising annealing at a temperature between about 250 C and about 400 C for a time period between about 0.5 hr and about 4 hrs.

7. A method comprising:
forming a first passivation layer over a first substrate;
forming a first plurality of recesses in the first passivation layer;
forming a first barrier layer in the first plurality of recess; and
forming a first plurality of conductive pads in the first plurality of recesses, the first barrier layer contacting bottoms and sidewalls of the first plurality of conductive pads, wherein a reduction potential difference between the first barrier layer and each of the first plurality of conductive pads is between about −1V and about +1V.

8. The method of claim 7, wherein forming the first barrier layer comprises:
forming a first barrier sublayer in the first plurality of recess; and
forming a second barrier sublayer over the first barrier sublayer.

9. The method of claim 8, wherein the first barrier sublayer comprises tantalum nitride (TaN) and the second barrier sublayer comprises cobalt (Co), nickel (Ni), or iron (Fe).

10. The method of claim 7, wherein forming the first passivation layer comprises:
forming a first passivation sublayer over the first substrate;
forming a second passivation sublayer over the first passivation sublayer;
forming a third passivation sublayer over the second passivation sublayer; and
forming a fourth passivation sublayer over the third passivation sublayer.

11. The method of claim 10, wherein the first passivation sublayer comprises undoped silicon glass (USG), the second passivation sublayer comprises silicon nitride (SiN), the third passivation sublayer comprises USG, and the fourth passivation sublayer comprises silicon oxynitrade (SiON).

12. The method of claim 10, wherein the first plurality of recesses extends through the fourth passivation sublayer, the third passivation sublayer, and the second passivation sublayer.

13. The method of claim 7, further comprising planarizing the first plurality of conductive pads such that topmost surfaces of the first plurality of conductive pads are coplanar with a topmost surface of the first passivation layer.

14. A method comprising:
forming a first structure, wherein forming the first structure comprises:
forming a first passivation layer over a first substrate;
patterning the first passivation layer to form a first plurality of recesses in the first passivation layer;
forming a first barrier layer on bottoms and sidewalls of the first plurality of recesses, the first barrier layer comprising a first barrier sublayer formed of a first material and a second barrier sublayer formed of a second material, the first material being different from the second material; and
filling the first plurality of recesses with a third material to form a first plurality of conductive pads, the third material being different from the first material and the second material; and
directly bonding the first structure to a second structure, the second structure comprising a second substrate having a second plurality of conductive pads thereon, wherein the second structure is bonded to the first structure such that the first plurality of conductive pads are aligned with and bonded to respective ones of the second plurality of conductive pads.

15. The method of claim 14, further comprising:
forming a second passivation layer over the second substrate;
patterning the second passivation layer to form a second plurality of recesses in the second passivation layer;
forming a second barrier layer over the second passivation layer, the second barrier layer comprising a third barrier sublayer and a fourth barrier sublayer; and
forming the second plurality of conductive pads over the second barrier layer in the second plurality of recesses.

16. The method of claim 15, wherein a reduction potential difference between the second barrier layer and each of the second plurality of conductive pads is between about −1V and about +1V.

17. The method of claim 14, wherein a reduction potential difference between the first barrier layer and each of the first plurality of conductive pads is between about −1V and about +1V.

18. The method of claim 14, further comprising removing excess portions of the third material such that topmost surfaces the first plurality of conductive pads are coplanar with a topmost surface of the first passivation layer.

19. The method of claim 14, wherein directly bonding the first structure to the second structure comprises:
directly bonding the first passivation layer to a second passivation layer disposed over the second substrate; and directly bonding the first plurality of conductive pads to respective ones of the second plurality of conductive pads.

20. The method of claim 14, wherein forming the first passivation layer comprises:
forming a first passivation sublayer comprising undoped silicon glass (USG) over the first substrate;
forming a second passivation sublayer comprising silicon nitrade (SiN) over the first passivation sublayer;
forming a third passivation sublayer comprising USG over the second passivation sublayer; and
forming a fourth passivation sublayer comprising silicon oxynitrade (SiON) over the third passivation sublayer.

* * * * *